United States Patent
Ko

(10) Patent No.: US 6,517,690 B2
(45) Date of Patent: Feb. 11, 2003

(54) ROLLER ASSEMBLY FOR AN ELECTROPLATING APPARATUS

(76) Inventor: Jason Ko, No. 67-1, Tung-Yung Rd., Chungli Industrial Park, Chungli City, Taoyuan Hsien (TW)

( * ) Notice: Subject to any disclaimer, the term of this patent is extended or adjusted under 35 U.S.C. 154(b) by 63 days.

(21) Appl. No.: 09/897,551

(22) Filed: Jul. 2, 2001

(65) Prior Publication Data

US 2003/0000832 A1 Jan. 2, 2003

(51) Int. Cl.[7] ................................................ C25B 9/00
(52) U.S. Cl. ....................................................... 204/279
(58) Field of Search ........................................ 204/279

(56) References Cited

U.S. PATENT DOCUMENTS 6,024,849 A * 2/2000 Ko .............................. 204/279

* cited by examiner

Primary Examiner—Bruce F. Bell
(74) Attorney, Agent, or Firm—Merchant & Gould P.C.

(57) ABSTRACT

A roller assembly for an electroplating apparatus includes a plurality of feeding rollers adapted to advance a sheet-shaped workpiece, and a threaded rod disposed parallel to the feeding rollers and having a left-hand thread portion and a right-hand thread portion. Two guiding members are respectively formed with two threaded holes, which engage the left-hand and right-hand thread portions of the rod. A sensing unit detects the width of the workpiece to activate a controller and a driving unit, which rotates the rod so as to move the guiding members in opposite directions such that the guiding members abut against two opposite sides of the workpiece, thereby guiding the workpiece to move therebetween. Two conducting units are attached respectively to the guiding members for supplying cathode current to the sides of the workpiece.

3 Claims, 4 Drawing Sheets

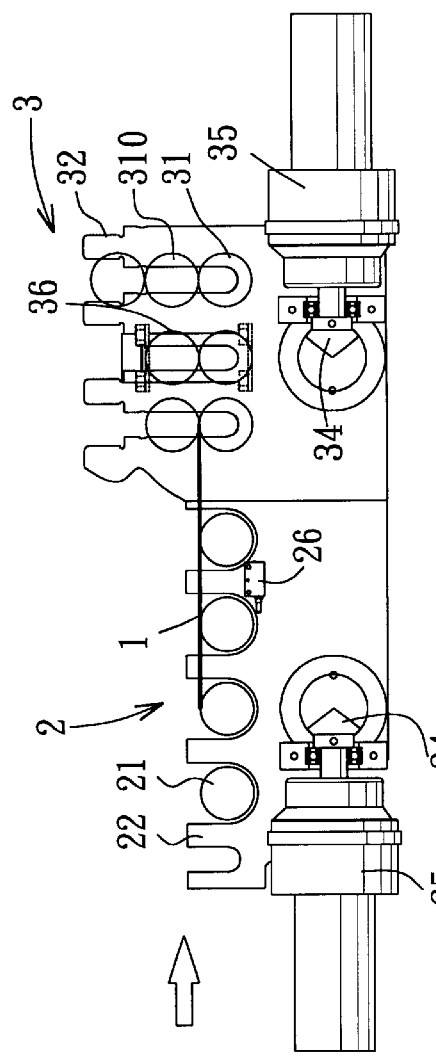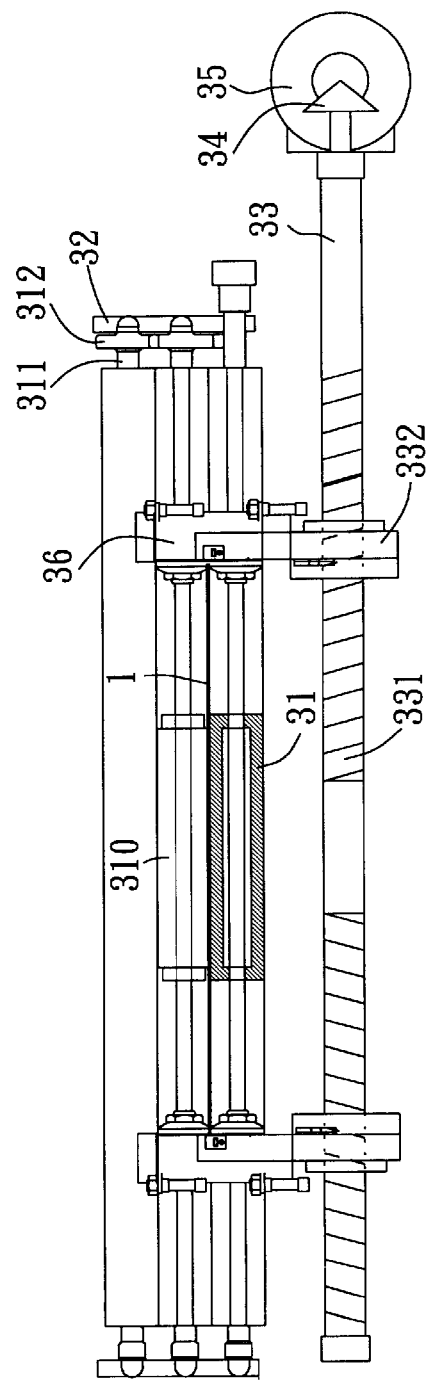

ROLLER ASSEMBLY FOR AN ELECTROPLATING APPARATUS

BACKGROUND OF THE INVENTION

1. Field of the Invention

This invention relates to a roller assembly for conveying a sheet-shaped workpiece in an electroplating apparatus, more particularly to a roller assembly, which is provided with at least one pair of guiding members for guiding the workpiece to move therebetween, thereby permitting accurate formation of a metal coating on target areas of the workpiece.

2. Description of the Related Art

Referring to FIG. 1, a conventional electroplating apparatus that is used in an automated manufacturing process of a printed circuit board is shown to include pairs of conducting rollers 7 disposed at upstream and downstream sides of an electroplating bath 9, which contains an electrolyte. A plurality of spray tubes 91, 92 and roller units 93 are provided inside the electroplating bath 9. The spray tubes 91, 92 not only function as anodes as they are connected electrically to a power source, but also spray an electrolyte onto a horizontal circuit board 8. Each of the roller units 93 includes a plurality of upper rollers 931 and a lower roller 932 to advance the board 8 through the electroplating bath 9. The upper rollers 932 are arranged such that they will move downward by virtue of gravity to place the lowermost upper roller 931 in contact with the corresponding lower roller 932 as soon as the board 8 moves past the inlet 94 and outlet 94 of the electroplating bath 9, thereby sealing the inlet 94 and the outlet 94 and preventing the electrolyte from leaking and staining the conducting rollers 7 provided outwardly of the electroplating bath 9.

The disadvantages of the aforesaid electroplating apparatus are as follows:

(1) A photosensitive film is applied to a surface of the board 8 prior to electroplating. Hence, the surface of the board 8 has a film area to be electroplated, and a bare copper area for contact with the roller units 93. Because no guiding means is provided for guiding the bare copper area of the board 8 to move in a direction that is perpendicular to the rollers 931, 932, the roller units 93 often press on the film area. As a result, it is difficult to form a desired circuit pattern on the board 8.

(2) A resistance loss is incurred on the conducting roller 7, and increases gradually from one end to another end in view of the condition that only a single cathode current input is provided to one end of the conducting roller 7, thereby resulting in an uneven thickness of metal coating on the board 8.

SUMMARY OF THE INVENTION

An object of this invention is to provide a roller assembly for an electroplating apparatus, which is provided with at least one pair of guiding members, the positions of which can be adjusted automatically according to the width of a sheet-shaped workpiece so as to guide the workpiece to move therebetween, thereby permitting accurate formation of a metal coating on target areas of the workpiece.

Another object of this invention is to provide a roller assembly for an electroplating apparatus, which can supply cathode current simultaneously to two opposite sides of a sheet-shaped workpiece, thereby forming a uniform-thickness of metal coating on the workpiece.

According to this invention, a roller assembly for an electroplating apparatus includes a plurality of feeding rollers adapted to advance a sheet-shaped workpiece, and a threaded rod disposed parallel to the feeding rollers and having a left-hand thread portion and a right-hand thread portion. Two guiding members are respectively formed with two threaded holes, which engage the left-hand and right-hand thread portions of the rod. A sensing unit detects the width of the workpiece to activate a controller and a driving unit, which rotates the rod so as to move the guiding members in opposite directions such that the guiding members abut against two opposite sides of the workpiece, thereby guiding the workpiece to move therebetween. Two conducting units are attached respectively to the guiding members for supplying cathode current to the sides of the workpiece.

BRIEF DESCRIPTION OF THE DRAWINGS

These and other features and advantages of this invention will become apparent in the following detailed description of a preferred embodiment of this invention, with reference to the accompanying drawings, in which:

FIG. 3 is a schematic side view of the preferred embodiment;

FIG. 4 is a schematic side view of a conducting mechanism of the preferred embodiment.

DETAILED DESCRIPTION OF THE PREFERRED EMBODIMENT

Figure 1:
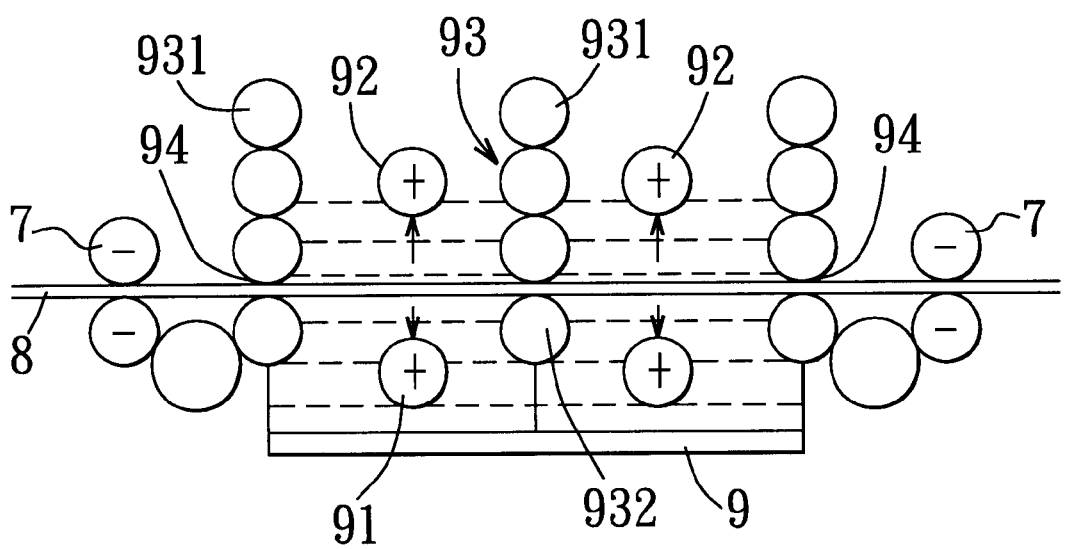
FIG. 1 is a schematic view of a conventional electroplating apparatus for electroplating a circuit board.
Figure 2:
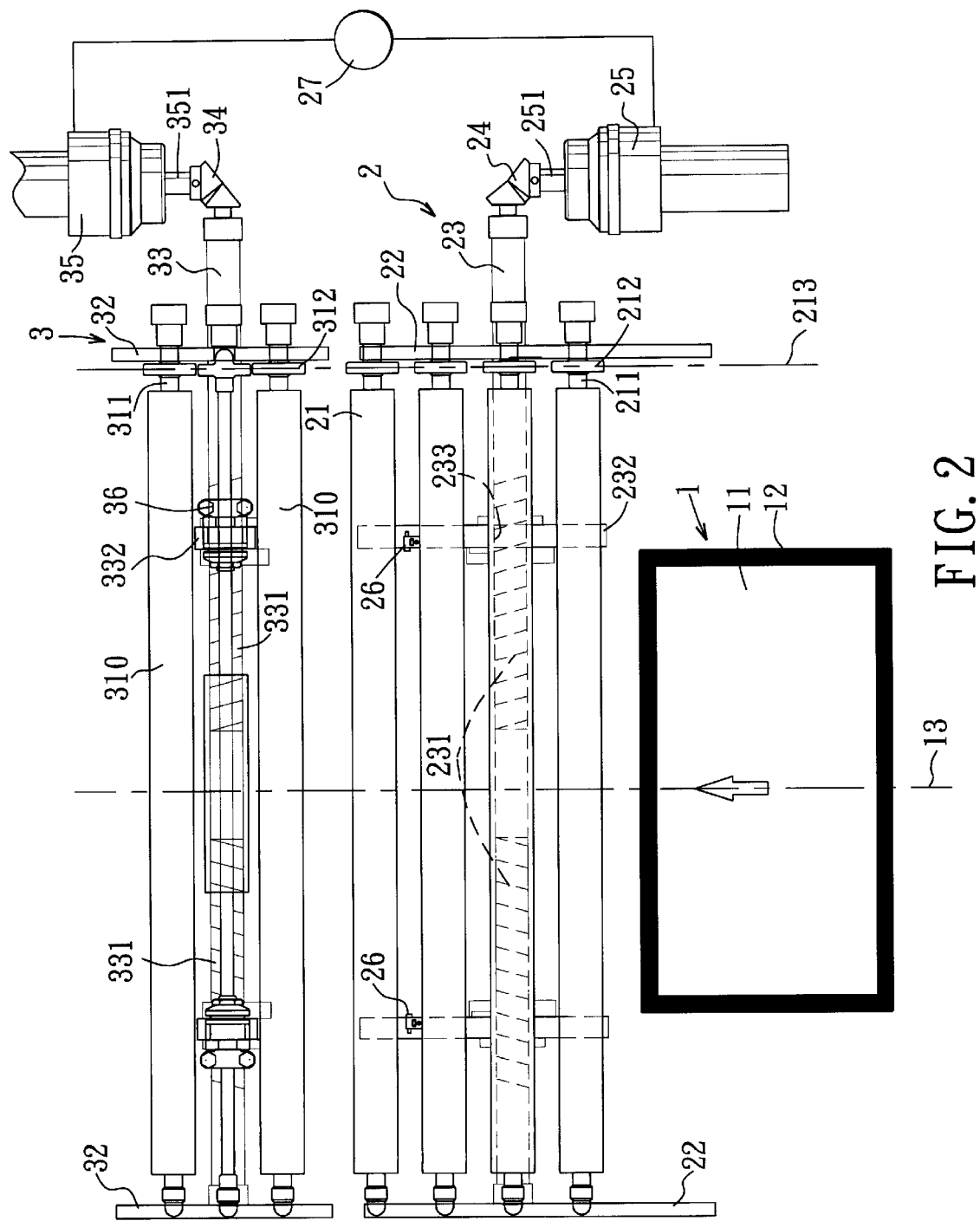
FIG. 2 is a schematic top view of the preferred embodiment of a roller assembly for an electroplating apparatus according to this invention.

Referring to FIGS. 2 and 3, the preferred embodiment of a roller assembly for an electroplating apparatus is shown to include a feeding mechanism 2 and a conducting unit 3.

The feeding mechanism 2 includes a plurality of feeding rollers 21 adapted to feed a sheet-shaped workpiece, such as a horizontal circuit board 1, a first threaded rod 23, a first driving unit consisting of a bevel gear set 24 and a first servomotor 25, and a position sensing unit including a pair of sensors 26. The feeding rollers 21 and the first threaded rod 23 are parallel to one another, and are journalled on and between two frames 22. The first feeding rollers 21 have fixed rotating shafts 211, each of which is provided with a fixed sprocket 212 that is rotated by a chain unit 213. The first threaded rod 23 is formed with a left-hand thread portion 231 and a right-hand thread portion 231, which are symmetrical along a hypothetical middle line 13 of the board 1 that extends in a predetermined direction, in which the board 1 advances. Two first guiding members 232 have two threaded holes 233, which engage respectively and threadably the left-hand and right-hand thread portions 231 of the first threaded rod 23. As such, when the first threaded rod 23 rotates, the first guiding members 232 move in opposite directions. The sensors 26 are attached to the first guiding members 232, respectively, so as to detect the width of the board 1, thereby sending a signal to a controller 27, which is connected electrically to the first servomotor 25. Subsequently, a motor shaft 251 of the first servomotor 25 rotates. The rotation of the motor shaft 251 will be transferred to the first threaded rod 23 by means of the bevel gear set 24 so as to move the first guiding members 232 in opposite directions until the distance between the first guiding members 232 is equal to the width of the board 1. Accordingly, the first guiding members 232 abut respectively against two opposite sides of the board 1, thereby guiding the board 1 to move therebetween in the predetermined direction.

The conducting mechanism 3 includes two lower rollers 31, a second threaded rod 33, and a second driving unit consisting of a bevel gear set 34 and a second servomotor 35. The lower rollers 31 are disposed at the same level as the feeding rollers 21, and have a pair of fixed rotating shafts 311, each of which is provided with a fixed sprocket 312 that is driven by the chain unit 213. The rotating shafts 311 are journalled between and on two frames 32. Each of the lower rollers 31 is associated with an upper roller 310 so as to move the board 1 therebetween. The second threaded rod 33 is similar to the first threaded rod 23 in construction, and has a left-hand thread portion 331 and a right-hand thread portion 331, which engage two second guiding members 332. Two conducting units are attached respectively to the second guiding members 332. In this embodiment, each of the conducting units includes two conducting rollers 36, which are disposed between the lower rollers 31 and which are arranged one above another. The second servomotor 35 is coupled to the second threaded rod 33 by means of the bevel gear set 34, and has a motor shaft 351 that is aligned with the shaft 251 of the first servomotor 25 and that is perpendicular to the feeding rollers 21. Because the first and second servomotors 25, 35 are connected to the controller 27, they can be activated simultaneously, thereby permitting synchronous rotation of the first and second threaded rods 23, 33.

Figure 5:
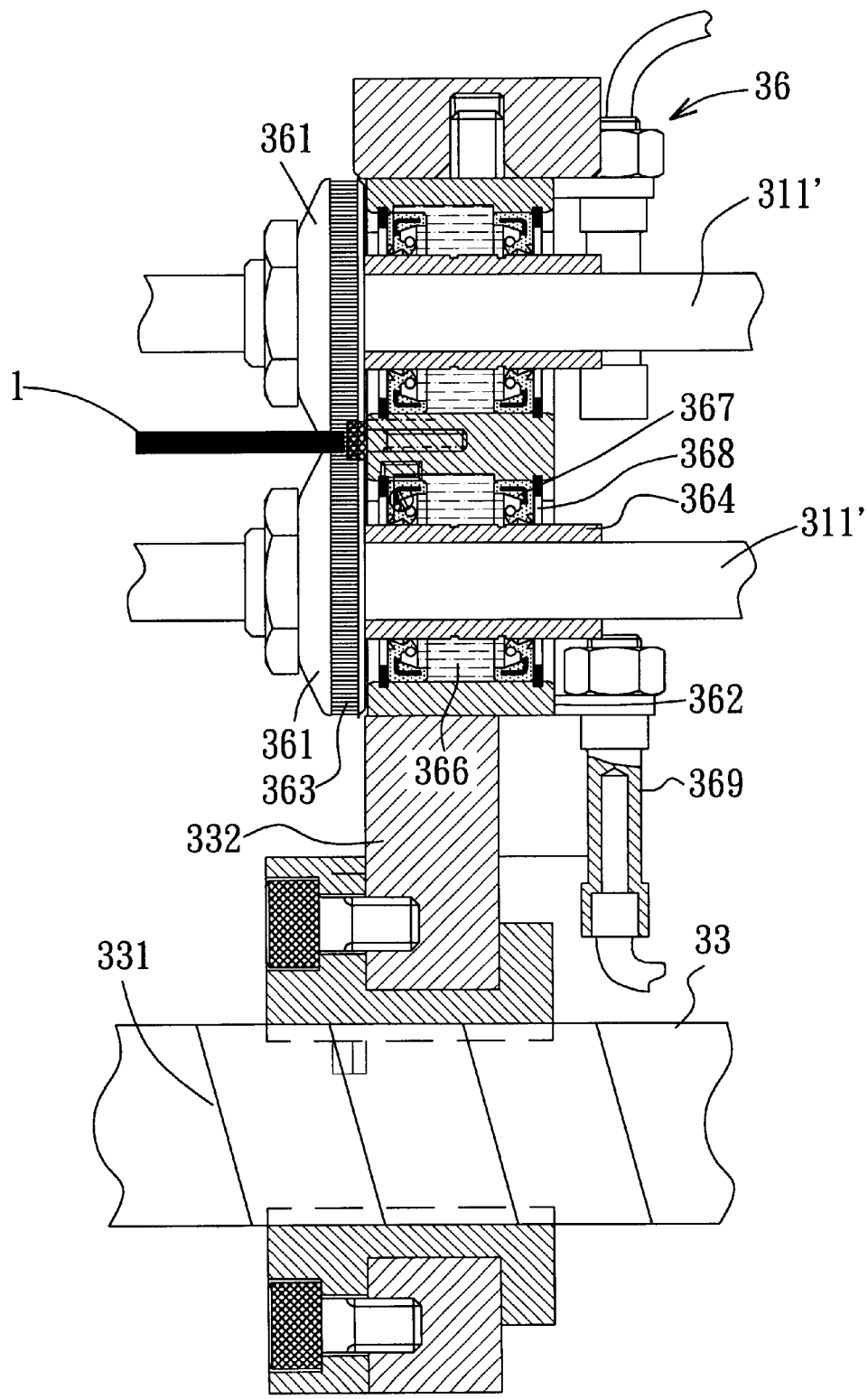
FIG. 5 is a fragmentary schematic side view of the conducting mechanism of the preferred embodiment, illustrating how two guiding rollers are arranged relative to a threaded rod.

Referring to FIGS. 4 and 5, each of the conducting rollers 36 includes a conductive ring 361, an annular conducting seat 362, a conductive bushing 364, two annular seals 367, two retaining rings 368, and a terminal pin 369. Only one of the conducting rollers 36 is described in the succeeding paragraph.

The conductive ring 361 and the conductive bushing 364 are interconnected fixedly, and are sleeved movably on a roller shaft 311', which is journalled on the frames 32. The conducting seat 362 is disposed around the bushing 364, and is fixed on the corresponding second guiding member 332. As such, when the second threaded rod 33 rotates to move the second guiding members 332 thereon, the conductive ring 361 and the conductive bushing 364 move on the roller shaft 311'. The annular seals 367 are sleeved fixedly on the roller shaft 311' by means of the retaining rings 368 so as to define a sealed annular gap between the conducting seat 362 and the conductive bushing 364 and between the seals 367, within which a conductive liquid 366 is filled. Accordingly, an electrical connection is established between the conducting seat 362 and the conductive bushing 364. The terminal pin 369 is fixed to the conducting seat 362 for electrical connection therewith, and is adapted to be connected to a negative side of a power supply (not shown), thereby transmitting cathode current from the terminal pin 369 to the conductive ring 361 via the conductive liquid 366 and the conductive bushing 364. The conductive ring 361 has an outer periphery that is formed with a contact portion 363 for electrical contact with a peripheral bare copper area 12 (see FIG. 2) of the board 1, which surrounds a film area (see FIG. 2).

Accordingly, the positions of the first and second guiding members 232, 332 can be adjusted automatically according to the width of the board 1 so as to guide the latter to move therebetween, thereby permitting accurate formation of a metal coating on the board 1.

Furthermore, the conducting rollers 36 can supply cathode current simultaneously to two opposite sides of the board 1, thereby forming a uniform-thickness of metal coating on the same.

With this invention thus explained, it is apparent that numerous modifications and variations can be made without departing the scope and spirit of this invention. It is therefore intended that this invention be limited only as indicated by the appended claims.

I claim:

1. A roller assembly for conveying a sheet-shaped workpiece in an electroplating apparatus in a predetermined direction, the workpiece having a hypothetical middle line that extends along the predetermined direction, said roller assembly comprising:

a feeding mechanism including
a plurality of feeding rollers,
a first threaded rod disposed parallel to said feeding rollers and having a left-hand thread portion and a right-hand thread portion, which are adapted to be disposed symmetrical along the middle line of the workpiece,
two first guiding members formed respectively with a pair of threaded holes that engage respectively said left-hand and right-hand thread portions of said first threaded rod so as to move said first guiding members in opposite directions on said first threaded rod when said first threaded rod rotates, said first guiding members being adapted to abut against two opposite sides of the workpiece, thereby guiding the workpiece to move in the predetermined direction, and
a first driving unit for rotating said first threaded rod;

a conducting mechanism including
a second threaded rod disposed parallel to said first threaded rod and having a left-hand thread portion and a right-hand thread portion, which are adapted to be disposed symmetrical along the middle line of the workpiece,
two second guiding members formed respectively with a pair of threaded holes that engage respectively said left-hand and right-hand thread portions of said second threaded rod so as to move said second guiding members in opposite directions on said second threaded rod when said second threaded rod rotates, said second guiding members being adapted to abut against the sides of the workpiece, thereby guiding the workpiece to move in the predetermined direction,
a second driving unit for rotating said second threaded rod, and
two conducting units attached respectively to said second guiding members and adapted to supply electric current to the sides of the workpiece, respectively;

a controller connected electrically to said first and second driving units so as to activate said first and second driving units simultaneously, thereby permitting synchronous rotation of said first and second threaded rods; and a position sensing unit connected electrically to said controller and adapted to detect width of the workpiece so as to activate said controller such that said first and second driving units move said first and second guiding members relative to said first and second threaded rods until a distance between said first guiding members and a distance between said second guiding members are equal to the width of the workpiece.

2. The roller assembly as claimed in claim 1, wherein each of said first and second driving units includes a servomotor with a motor shaft that is perpendicular to said feeding rollers, and a bevel gear set that interconnects said motor shaft and a respective one of said first and second threaded rods so as to transfer rotation of said motor shaft to the respective one of said first and second threaded rods.

3. The roller assembly as claimed in claim 1, wherein each of said conducting units includes two conducting rollers, which are arranged one above another, each of said conducting rollers including:

an annular conducting seat fixed on a respective one of said second guiding members;

a terminal pin connected fixedly and electrically to said conducting seat and adapted to be connected electrically to a negative side of a power supply;

a roller shaft journalled within said conducting seat;

a conductive ring sleeved movably on said roller shaft and disposed rotatably relative to said conducting seat, said conductive ring being adapted to contact the workpiece for electrical connection therewith;

a conductive bushing sleeved rotatably on said roller shaft and connected fixedly to said conductive ring;

two annular seals sleeved fixedly on said conductive bushing so as to define a sealed annular gap between said conductive bushing and said conducting seat and between said seals; and a conductive liquid filled within said sealed annular gap, thereby establishing electrical connection between said conductive ring and said conducting seat.

* * * * *